United States Patent
Gilchrist et al.

[11] Patent Number: 5,846,375
[45] Date of Patent: Dec. 8, 1998

[54] AREA SPECIFIC TEMPERATURE CONTROL FOR ELECTRODE PLATES AND CHUCKS USED IN SEMICONDUCTOR PROCESSING EQUIPMENT

[75] Inventors: Robin Gilchrist; Michael S. Wilhoit, both of Boise, Id.

[73] Assignee: Micron Technology, Inc., Boise, Id.

[21] Appl. No.: 721,365

[22] Filed: Sep. 26, 1996

[51] Int. Cl.[6] .................................................. H05H 1/00
[52] U.S. Cl. ...................... 156/345; 118/723 E; 118/724; 118/725; 118/728; 165/80.1; 165/80.4; 165/80.5
[58] Field of Search .................................. 118/724, 725, 118/728, 723 E; 156/345; 165/80.1, 80.5, 80.2, 80.3, 80.4; 361/234

[56] References Cited

U.S. PATENT DOCUMENTS

| | | | |
|---|---|---|---|
| 4,399,016 | 8/1983 | Tsukada et al. | 204/192 |
| 4,565,601 | 1/1986 | Kakehi et al. | 156/643 |
| 5,192,849 | 3/1993 | Moslehi | 219/121 |
| 5,213,349 | 5/1993 | Elliott | 361/234 X |
| 5,294,778 | 3/1994 | Carmen et al. | 219/385 |
| 5,567,267 | 10/1996 | Kazama et al. | 156/345 |

*Primary Examiner*—Thi Dang
*Attorney, Agent, or Firm*—Ormiston Korfanta Dunbar & Holland, PLLC

[57] ABSTRACT

A temperature control system to selectively control the temperature of specific areas of the chuck or electrode plate upon which a wafer is mounted during plasma etching, chemical vapor deposition and other such temperature dependent processes for the purpose of ultimately controlling the temperature of the semiconductor wafer. The temperature control system includes a plurality of conduits arranged about the center of the chuck as a series of concentric radially adjacent loops. Each conduit is connected to its own inlet and outlet to allow a heating or cooling agent to flow independently through each conduit.

17 Claims, 4 Drawing Sheets

5,846,375

AREA SPECIFIC TEMPERATURE CONTROL FOR ELECTRODE PLATES AND CHUCKS USED IN SEMICONDUCTOR PROCESSING EQUIPMENT

FIELD OF THE INVENTION

The invention relates generally to semiconductor processing equipment and, more particularly, to an area specific temperature control for electrode plates and chucks used to hold wafers in semiconductor processing equipment.

BACKGROUND OF THE INVENTION

Semiconductor devices are mass produced by forming many identical circuit patterns on a single silicon wafer which is thereafter cut into many identical dies or "chips." Semiconductor devices, also commonly referred to as integrated circuits, are typically constructed by successively depositing or "stacking" layers of various materials on the wafer. Portions of some of the layers are etched away according to a predetermined pattern as part of the formation of the desired circuit components. Various processing techniques are used to deposit, pattern and etch the materials necessary to construct the finished device. Pertinent to the present invention are those processing techniques that require the introduction of gases into a reaction chamber or vessel. The gases react with one another and with the surface of the semiconductor wafers to deposit or remove the desired materials. Plasma enhanced chemical vapor deposition ("CVD") and reactive plasma etching are two common semiconductor manufacturing processes that use reactant gases to deposit materials on and selectively remove materials from the surface of a semiconductor wafer, respectively.

In plasma assisted processing, a substantially ionized gas provides activated neutral and ionic species that chemically react in a reaction chamber to deposit or etch material layers on the semiconductor wafers. A reactive plasma etching machine, for example, typically includes a pair of electrodes plates positioned opposite and parallel to one another in an enclosed reaction chamber. A photolithographic etch mask is used to form the desired circuit elements on the wafer. The process of photolithographic masking consists of creating a photolithographic mask containing the pattern of the component to be formed, coating the wafer with a light sensitive polymer material called photoresist, exposing the photoresist coated wafer to ultraviolet light through the mask to soften or harden parts of the photoresist (depending on whether positive or negative photoresist is used), removing the softened parts of the photoresist, etching away the materials on the wafer left unprotected by the photoresist, and striping off the remaining photoresist. After the mask is formed, the semiconductor wafer is mounted to one of the surface of one of the electrodes. Etching is initiated and maintained by applying a high frequency alternating current (a.c.) voltage between the electrodes to produce a plasma in the chamber. The chemically active species in the plasma interact to remove material from the surfaces of the wafer that are not protected by the photoresist.

During the etching process, the photoresist mask and the exposed surfaces of the wafer are heated by the collision of ions or electrons in the plasma and by the chemical reaction energy generated during the etching process at the exposed surface of the wafer. Unless the wafer is cooled, the photoresist may degenerate and, thus, adversely effect the precision of the pattern etched into the wafer. A wafer holding chuck, such as one of the electrodes in the reactive plasma etching machine, is usually cooled during etching to reduce the temperature of the wafer and to alleviate the thermal damage to the photoresist. It is also desirable to control the temperature of the wafer to control the etch rate and promote a uniform etch fully across the wafer.

Current designs of wafer mounting chucks and electrode plates used in gas processing systems typically utilize a single conduit to channel a cooling or heating agent through the chuck to control the temperature of the wafer. In U.S. Pat. No. 5,192,849 issued to Moslehi on Mar. 9, 1993 and entitled Multiple Low-Thermal-Mass Chuck For Semiconductor Processing Equipment a dual channel system is disclosed. The Moslehi patent proposes two parallel coolant channels with opposite flows that traverse back and forth across the face of the wafer mounting chuck. The dual channel system of Moslehi is designed to promote uniform wafer cooling using a gas or liquid coolant. The single conduit systems and the dual channel system disclosed in the Moslehi patent provide only global temperature control. That is, they do not allow for controlling the temperature of specific areas of the wafers. Although it is usually desirable to uniformly heat or cool the entire wafer, a non-uniform temperature gradient across the wafer is sometimes preferred. In addition, it may be necessary to achieve a uniform temperature profile across the wafer to subject specific areas on the wafer to varying degrees of cooling or heating.

Accordingly, it is desirable to have a chuck or electrode plate temperature control system that is capable of providing a desired temperature profile or gradient across the wafer by selectively heating or cooling specific areas of the wafer. One system proposed for achieving either a uniform or non-uniform temperature gradient/profile across a CVD platen is disclosed in Carman et al., U.S. Pat. No. 5,294,778 issued Mar. 15, 1994 and entitled CVD Platen Heater System Utilizing Concentric Electric Heating Elements. The Carman patent describes a multiple coil electrical resistance heater system buried in a CVD platen. The system consists of three elements—a spiral shaped main heating coil and inner and outer single heating loops. Electrical power to each of the individual resistance heaters can be varied to provide a uniform flat temperature profile or a smooth temperature gradient across the platen. The resistance heating system of Carman, of course, cannot provide the cooling required in semiconductor fabrication processes such as plasma etching to preserve the integrity of the photoresist. In addition, the use of a spiral coil as the main heating element limits the extent to which area specific heating can be achieved.

SUMMARY OF THE INVENTION

The present invention is directed to a temperature control system for regulating the temperature of the chuck to which a wafer is mounted during plasma etching, chemical vapor deposition and other such temperature dependent processes for the purpose of ultimately controlling the temperature of the wafer. "Chuck" as used in this Specification and in the Claims refers generally to any mounting chuck, electrode plate or similar structure used to hold a wafer in semiconductor processing equipment. The temperature control system includes a set of conduits arranged about the center of the chuck as a series of concentric radially adjacent loops. Each conduit has its own inlet and outlet for allowing a heating or cooling agent to flow independently through each of the conduits.

In a second embodiment of the invention, the temperature control system is incorporated into a chuck for holding a semiconductor wafer in semiconductor processing equipment. The chuck consists of a generally disc shaped body to which the wafer is mounted during processing. The conduits are embedded in the body of the chuck and arranged about the center of the chuck as a series of concentric radially adjacent loops. Again, each conduit is connected to respective inlets and outlets to allow a heating or cooling agent to flow independently through each of the conduits.

In a third embodiment of the invention, the temperature control system is incorporated into a plasma type semiconductor processing device. The device includes a reaction chamber and a pair of electrode plates positioned opposite one another in the reaction chamber. During processing, the semiconductor wafers are mounted to one of the electrodes, designated herein as the first electrode. The temperature control system for regulating the temperature of the first electrode and the wafer mounted thereto comprises a plurality of conduits embedded in the first electrode and arranged about the center of the first electrode as a series of concentric radially adjacent loops. The plasma processing device will typically also include an inlet port for introducing etch chemicals into the reaction chamber and an exhaust port for exhausting materials from the reaction chamber. A power supply is provided to apply an a.c. voltage between the two electrodes to generate a plasma for the applicable etching or deposition process. A plurality of supply mechanisms corresponding to the number of conduits supply a cooling or heating agent independently to each of the conduits.

DETAILED DESCRIPTION OF THE INVENTION

Figure 1:
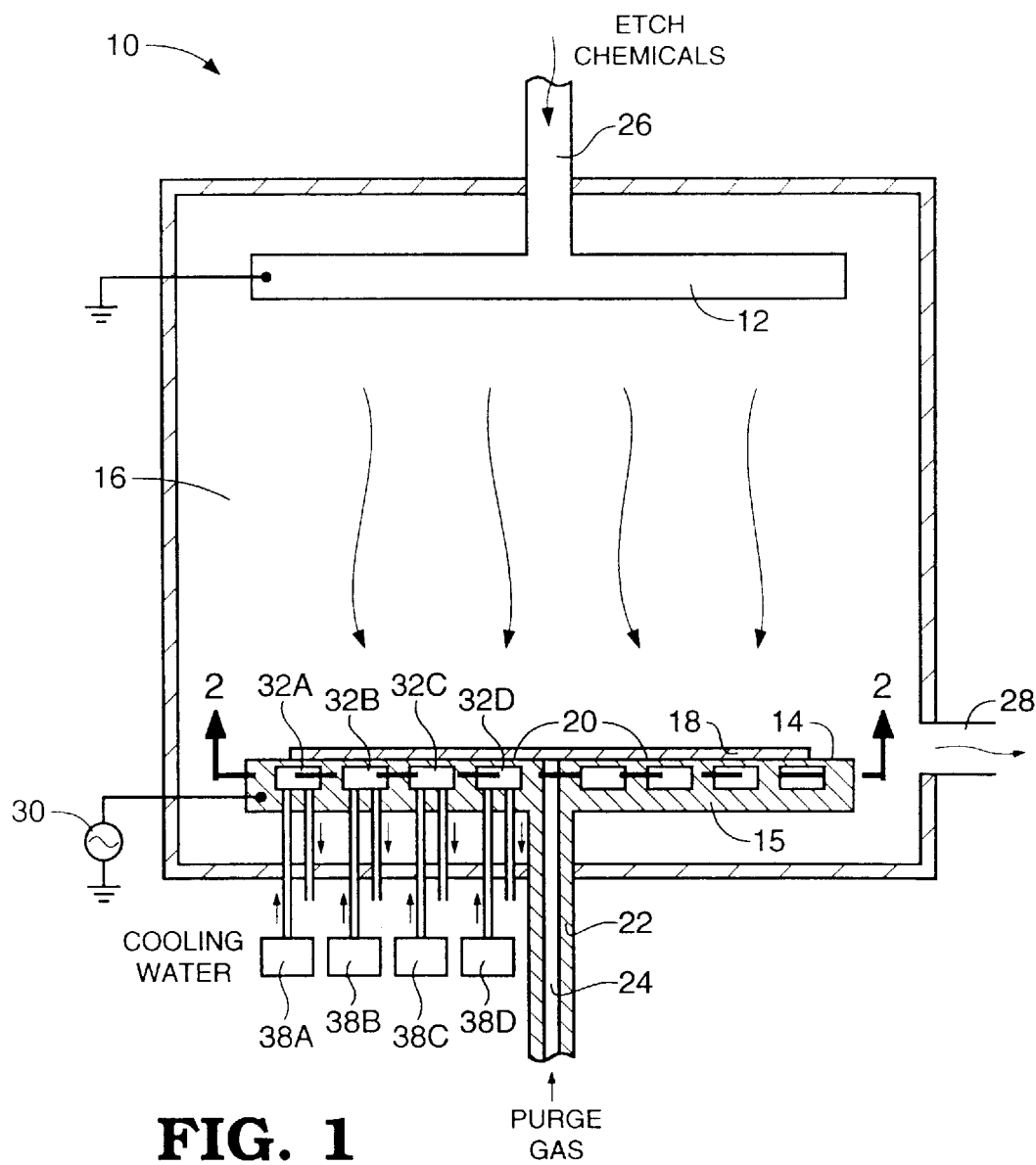
FIG. 1 is a partial cross section view illustrating the basic components of a dry etching device embodying the invention.

The temperature control system of the present invention will be described with reference to a typical plasma etching machine as one exemplary embodiment. The invention, however, is suitable for use in many plasma type semiconductor processing machines wherein a semiconductor wafer is mounted to a chuck during processing. FIG. 1 is a partial cross section view showing the basic components of a plasma etch machine which is designated generally by reference numeral 10. Top electrode 12 and bottom electrode 14 are situated parallel to and opposite one another in reaction chamber 16. A semiconductor wafer 18 is mounted to upper surface 20 of bottom electrode 14. Wafer 18 may be mechanically (clamped), vacuum (suction) or electrostatically mounted to bottom electrode 14. Bottom electrode 14 is supported on a shaft 22 which extends through the perimeter wall of reaction chamber 16. Thus, bottom electrode 14 also serves as a mounting chuck to hold and support the wafer and is generally illustrative of similar mounting pieces in other semiconductor processing equipment.

A purge gas such as helium or argon is supplied through channel 24 in shaft 22 to upper surface 20 of bottom electrode 14. Dispersion grooves (not shown) are typically formed in the upper surface 20 of bottom electrode 14 to distribute the flow of the purge gas about upper surface 20 and thereby improve the thermal contact between wafer 18 and bottom electrode 14. Etch chemicals are introduced into reaction chamber 16 through inlet port 26 and distributed through top electrode 14. Reaction by-products and excess purge gases are removed from reaction chamber 16 through exhaust port 28. A high frequency a.c. voltage is applied by power supply 30 between bottom electrode 14 (the cathode) and the grounded top electrode 12 (the anode). As a result, the etch chemicals between the two electrodes are reduced to a plasma to effect the etching process.

Figure 2:
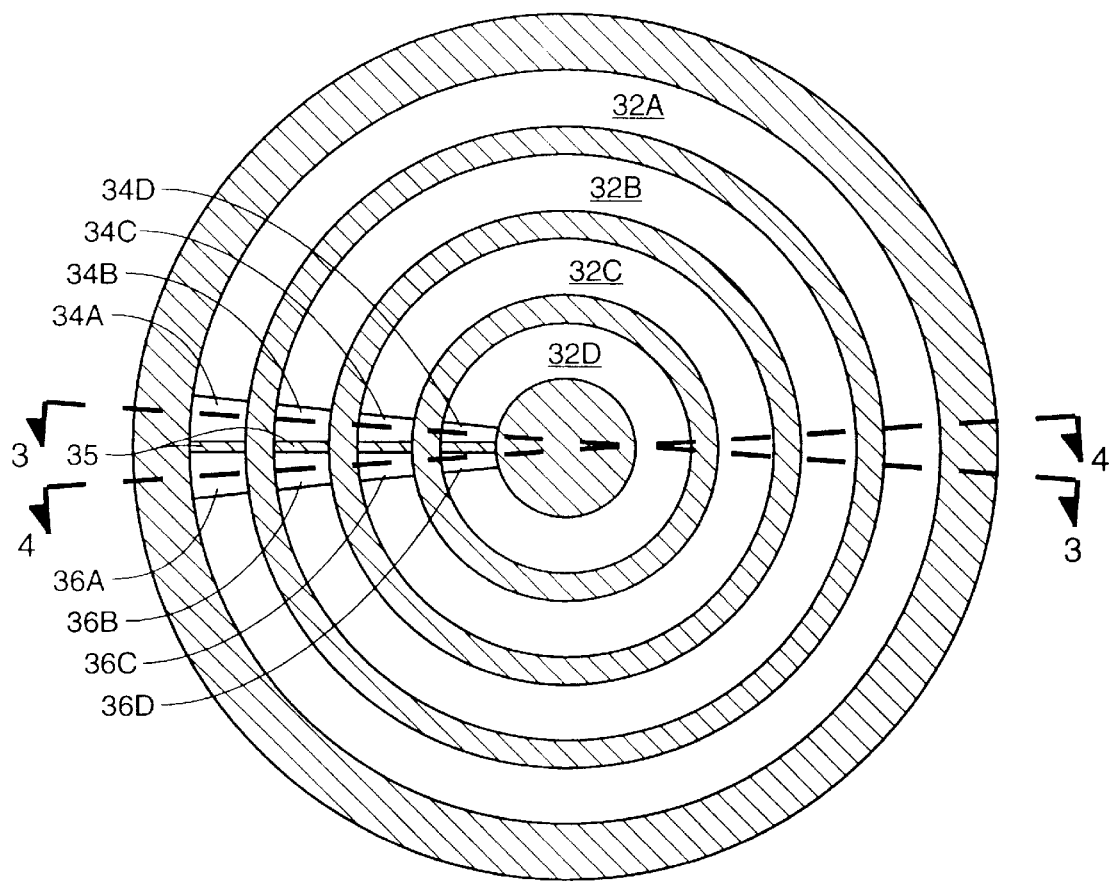
FIG. 2 is a top down cross section view of the lower electrode taken along the line 2—2 in FIG. 1 showing the concentric cooling conduits.
Figure 3:
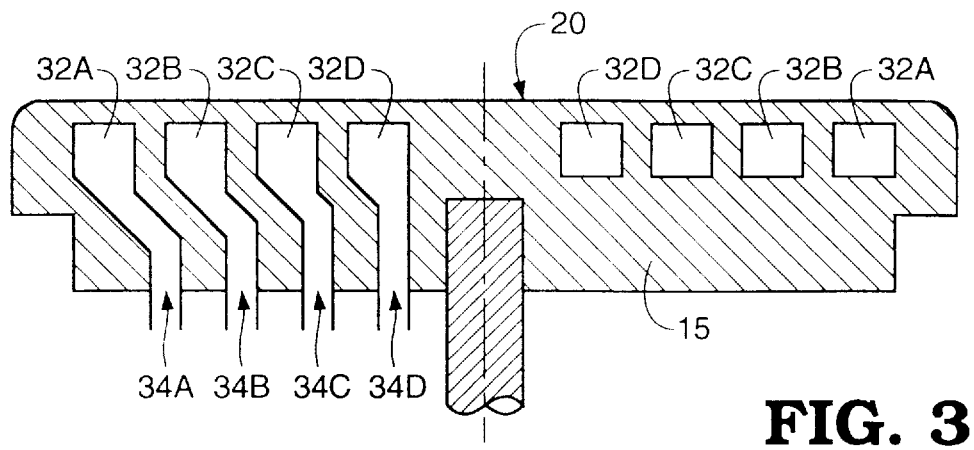
FIG. 3 is a side cross section view of the lower electrode taken along the line 3—3 in FIG. 2 showing the inlets to the cooling conduits.
Figure 4:
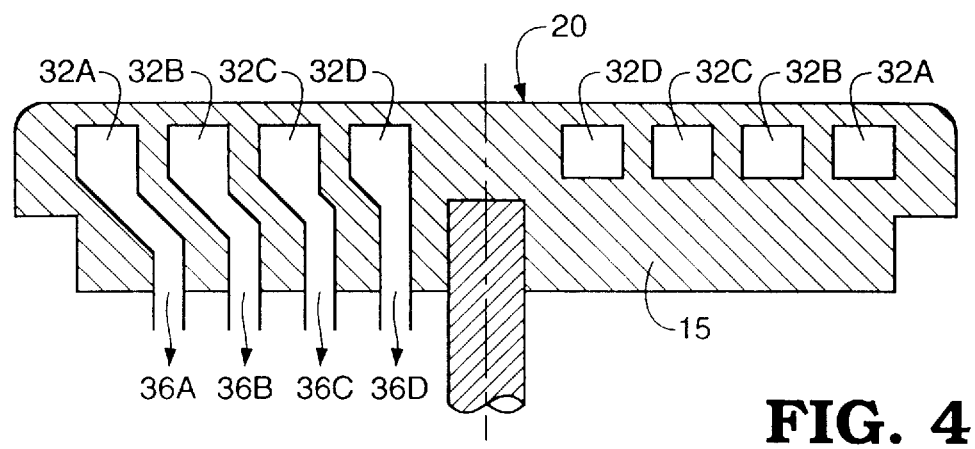
FIG. 4 is a side cross section view of the lower electrode taken along the line 4—4 in FIG. 2 showing the outlets from the cooling conduits.

The etching machine described thus far is illustrative of conventional plasma etchers commonly used throughout the semiconductor industry and the details of which are well known to those skilled in the art. The present invention, as detailed below, is directed to a temperature control system for regulating the temperature of bottom electrode 14 and, correspondingly, wafer 18 due to its thermal connectivity to bottom electrode 14. Referring now to FIGS. 1–4, wafer 18 is cooled during the etching process through a series of conduits 32a, 32b, 32c, and 32d embedded in the body 15 of bottom electrode 14. A coolant, typically water, flows into each conduit 32a–32d through inlets 34a–34d, respectively. The coolant flows out of each conduit 32a–32d through outlets 36a–36d. Conduits 32a–32d are arranged around the center of bottom electrode in radially adjacent loops as best seen in FIG. 2. The inlets 34a–34d and outlets 36a–36d are positioned as close together as possible to allow the coolant to flow around nearly the full circumference of conduits 32a–32d. Insulating spacers 35, shown in FIG. 2, may be inserted between the inlets and outlets to minimize heat transfer therebetween. Preferably, each conduit 32a–32d is connected to a coolant supply 38a–38d, respectively. In this way, the temperature of specific areas of wafer 18 can be independently regulated by varying the temperature and flow rate of the coolant supplied to each of the conduits 32a–32d. Coolant supply 38a–38d may be any suitable pumping system as is used in conventional single loop cooling systems.

Figure 5:
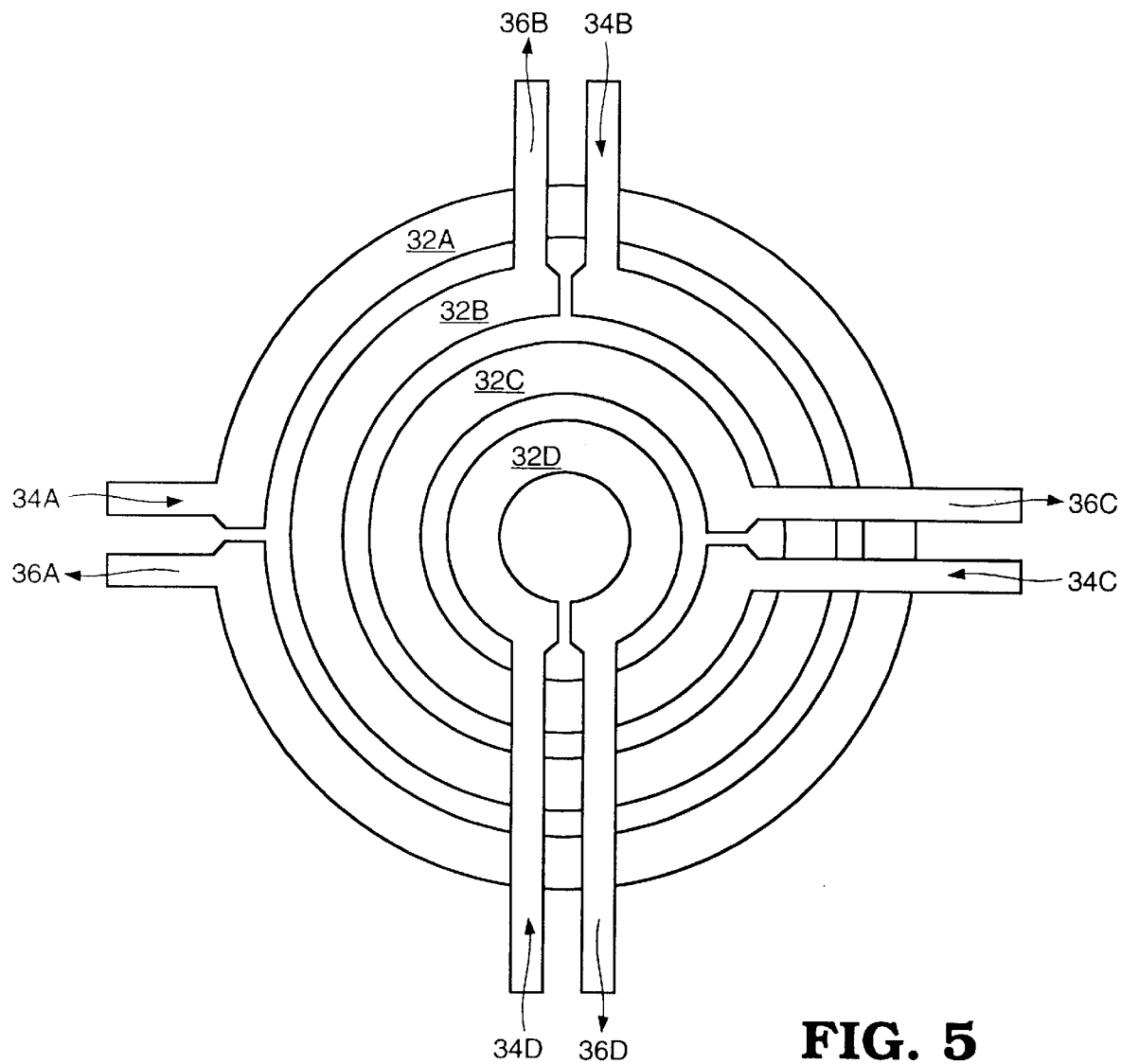
FIG. 5 is a diagrammatic representation of the heating/cooling conduits of the invention.

FIG. 5 illustrates generically one preferred configuration of the conduits 32a–32d. Each conduit 32a, 32b, 32c and 32d has a corresponding inlet 34a, 34b, 34c and 34d and outlet 36a, 36b, 36c and 36d. Although concentric circular loops are the preferred arrangement for conduits 32a–32d, alternative configurations are possible depending on the shape of the wafer or other workpiece, and the scope and degree of area specific temperature control that may be desired for a particular etching or deposition process. For example, square or rectangular loops might be preferred for flat panel substrates and elliptical loops for elliptical wafers. Also, concentric elliptical loops, octagons or the like might be desirable to vary the temperature gradient across the wafer according to predetermined etch parameters. The cross sectional size and shape and the number of the conduits may also be varied as necessary to achieve the desired cooling pattern. While water is typically used as the cooling agent, other liquid or gas cooling agents may be used.

While there is shown and described the presently preferred embodiments of the invention, it is to be understood that the invention is not limited thereto. The invention utilizes a series of conduits arranged in radially adjacent loops around the center of a plasma processing machine electrode plate or wafer mounting chuck. Thus, it becomes possible to regulate the temperature of specific areas of the chuck and, correspondingly, the semiconductor wafer mounted to the chuck. A cooling agent may be supplied to the conduits to cool the wafer in the case of plasma etching machines or, in the case of plasma enhanced chemical vapor deposition, a heating agent is supplied to the conduits to heat the wafers. A combined set of cooling and heating conduits might also be used. Accordingly, various modifications to the disclosed embodiments as well as alternative embodiments of the invention will become apparent to persons skilled in the art and fall within the scope of the invention as set forth in the following claims.

What is claimed is:

1. A plasma type semiconductor processing device, comprising:
   a. a reaction chamber;
   b. a first electrode in the reaction chamber, the first electrode having a surface to which a semiconductor wafer is mounted during processing;
   c. a second electrode disposed opposite the first electrode; and
   d. a plurality of conduits embedded in the first electrode and arranged about the center of the first electrode as a series of concentric radially adjacent loops.

2. A device according to claim 1, wherein the loops are circular.

3. A device according to claim 1, wherein the loops are elliptical.

4. A plasma type semiconductor processing device, comprising:
   a. a reaction chamber;
   b. a first electrode in the reaction chamber, the first electrode having a surface to which a semiconductor wafer is mounted during processing;
   c. a second electrode disposed opposite the first electrode; and
   d. a plurality of conduits embedded in the first electrode and arranged about the center of the first electrode as a series of concentric radially adjacent loops; and
   e. a plurality of inlets and outlets for allowing a heating or cooling agent to flow through the conduits, respective ones of the inlets and outlets being connected to respective ones of the conduits.

5. A plasma type semiconductor processing device, comprising:
   a. a reaction chamber;
   b. a first electrode in the reaction chamber, the first electrode having a surface to which a semiconductor wafer is mounted during processing;
   c. a second electrode disposed opposite the first electrode;
   d. a plurality of conduits embedded in the first electrode and arranged about the center of the first electrode as a series of concentric radially adjacent loops;
   e. an inlet port connected to the reaction chamber for introducing materials into the reaction chamber; and
   f. an exhaust port connected to the reaction chamber for exhausting materials from the chamber.

6. A plasma type semiconductor processing device, comprising:
   a. a reaction chamber;
   b. a first electrode in the reaction chamber, the first electrode having a surface to which a semiconductor wafer is mounted during processing;
   c. a second electrode disposed opposite the first electrode; and
   d. a plurality of conduits embedded in the first electrode and arranged about the center of the first electrode as a series of concentric radially adjacent loops; and
   e. a source of a.c. voltage operatively coupled to one of the electrodes for applying an a.c. voltage between the first and second electrodes.

7. A plasma type semiconductor processing device, comprising:
   a. a reaction chamber;
   b. a first electrode in the reaction chamber, the first electrode having a surface to which a semiconductor wafer is mounted during processing;
   c. a second electrode disposed opposite the first electrode; and
   d. a plurality of conduits embedded in the first electrode and arranged about the center of the first electrode as a series of concentric radially adjacent loops; and
   e. a plurality of supply mechanisms for supplying a cooling agent to each of the conduits, respective ones of the supply mechanisms being operatively coupled to respective ones of the conduits.

8. A plasma type semiconductor processing device, comprising:
   a. a reaction chamber;
   b. a first electrode in the reaction chamber, the first electrode having a surface to which a semiconductor wafer is mounted during processing;
   c. a second electrode disposed opposite the first electrode; and
   d. a plurality of conduits embedded in the first electrode and arranged about the center of the first electrode as a series of concentric radially adjacent loops; and
   e. a plurality of supply mechanisms for supplying a heating agent to each of the conduits, respective ones of the supply mechanisms being operatively coupled to respective ones of the conduits.

9. A temperature control system for regulating the temperature of a chuck used to hold a wafer in semiconductor processing equipment, the temperature control system comprising a plurality of conduits arranged about the center of the chuck as a series of concentric radially adjacent loops.

10. A temperature control system according to claim 9, wherein the loops are circular.

11. A temperature control system according to claim 9, wherein the loops are elliptical.

12. A temperature control system for regulating the temperature of a chuck used to hold a wafer in semiconductor processing equipment, the temperature control system comprising a plurality of conduits embedded in the chuck and arranged about the center of the chuck as a series of concentric radially adjacent loops.

13. A temperature control system for regulating the temperature of a chuck used to hold a wafer in semiconductor processing equipment, the temperature control system comprising:
   a. a plurality of conduits arranged about the center of the chuck as a series of concentric radially adjacent loops; and
   b. a plurality of inlets and outlets for allowing a heating or cooling agent to flow through the conduits, respective ones of the inlets and outlets being connected to respective ones of the conduits.

14. A chuck for holding a semiconductor wafer in semiconductor processing equipment, the chuck comprising:

a. a generally disc shaped body to which the wafer is mounted during processing; and b. a plurality of conduits embedded in the body of the chuck and arranged about the center of the chuck as a series of concentric radially adjacent loops.

15. A chuck according to claim 14, wherein the loops are circular.

16. A chuck according to claim 14, wherein the loops are elliptical.

17. A chuck for holding a semiconductor wafer in semiconductor processing equipment, the chuck comprising:

a. a generally disc shaped body to which the wafer is mounted during processing;

b. a plurality of conduits embedded in the body of the chuck and arranged about the center of the chuck as a series of concentric radially adjacent loops; and c. a plurality of inlets and outlets for allowing a heating or cooling agent to flow through the conduits, respective ones of the inlets and outlets being connected to respective ones of the conduits.

* * * * *